United States Patent
Sudo

(10) Patent No.: US 7,281,189 B2
(45) Date of Patent: Oct. 9, 2007

(54) APPARATUS AND METHOD FOR SEPARATELY MODULATING SYSTEMATIC BITS AND PARITY BITS IN ACCORDANCE WITH COMMUNICATION QUALITY

(75) Inventor: Hiroaki Sudo, Yokohama (JP)

(73) Assignee: Matsushita Electric Indutrial Co., Ltd., Osaka (JP)

( * ) Notice: Subject to any disclaimer, the term of this patent is extended or adjusted under 35 U.S.C. 154(b) by 0 days.

(21) Appl. No.: 10/515,913

(22) PCT Filed: Oct. 29, 2003

(86) PCT No.: PCT/JP03/13806

§ 371 (c)(1),
(2), (4) Date: Nov. 29, 2004

(87) PCT Pub. No.: WO2004/040832

PCT Pub. Date: May 13, 2004

(65) Prior Publication Data

US 2005/0229073 A1  Oct. 13, 2005

(30) Foreign Application Priority Data

Oct. 31, 2002 (JP) .............................. 2002-317728
Dec. 2, 2002 (JP) .............................. 2002-350026

(51) Int. Cl.
*H03M 13/00* (2006.01)
(52) U.S. Cl. .................... 714/755; 714/758; 370/335
(58) Field of Classification Search ................ 375/261; 714/755, 758
See application file for complete search history.

(56) References Cited

U.S. PATENT DOCUMENTS

| 5,504,775 | A | | 4/1996 | Chouly et al. | |
|---|---|---|---|---|---|
| 5,764,699 | A | * | 6/1998 | Needham et al. | 375/261 |
| 5,828,677 | A | * | 10/1998 | Sayeed et al. | 714/774 |
| 6,151,296 | A | * | 11/2000 | Vijayan et al. | 370/208 |
| 6,208,663 | B1 | * | 3/2001 | Schramm et al. | 370/465 |
| 6,452,964 | B1 | * | 9/2002 | Yoshida | 375/222 |
| 6,490,243 | B1 | | 12/2002 | Tanaka et al. | |
| 6,631,127 | B1 | * | 10/2003 | Ahmed et al. | 370/349 |
| 6,865,233 | B1 | * | 3/2005 | Eriksson et al. | 375/261 |

(Continued)

FOREIGN PATENT DOCUMENTS

JP       11330984        11/1999

(Continued)

OTHER PUBLICATIONS

International Search Report dated Dec. 9, 2003.

(Continued)

*Primary Examiner*—Guy Lamarre
*Assistant Examiner*—Sam Rizk
(74) *Attorney, Agent, or Firm*—Stevens, Davis, Miller & Mosher, LLP

(57) ABSTRACT

A transmission apparatus and method turbo-encode data and output systematic bit and parity bit data. The systematic bit data and the parity bit data are modulated independently of each other such that communication quality is better when a modulation scheme for the systematic bit data is changed than when a modulation scheme for the parity bit data is changed. The systematic bit data and the parity bit data are then transmitted.

8 Claims, 12 Drawing Sheets

U.S. PATENT DOCUMENTS

| | | | |
|---|---|---|---|
| 6,868,056 B1* | 3/2005 | Sudo | 370/210 |
| 6,940,915 B2* | 9/2005 | Tang | 375/261 |
| 7,002,900 B2* | 2/2006 | Walton et al. | 370/208 |
| 7,072,307 B2* | 7/2006 | Tong et al. | 370/253 |
| 2002/0163975 A1* | 11/2002 | Uesugi et al. | 375/295 |
| 2002/0199147 A1* | 12/2002 | Kim et al. | 714/748 |
| 2003/0007476 A1* | 1/2003 | Kim et al. | 370/342 |
| 2003/0014709 A1* | 1/2003 | Miyoshi et al. | 714/758 |
| 2003/0021240 A1* | 1/2003 | Moon et al. | 370/320 |
| 2003/0060173 A1* | 3/2003 | Lee et al. | 455/103 |
| 2003/0088822 A1* | 5/2003 | Kim et al. | 714/790 |
| 2004/0085892 A1* | 5/2004 | Walton et al. | 370/208 |
| 2004/0184553 A1* | 9/2004 | Hottinen | 375/264 |
| 2005/0201338 A1* | 9/2005 | Takano | 370/335 |

FOREIGN PATENT DOCUMENTS

| | | |
|---|---|---|
| JP | 2002164795 | 6/2002 |
| JP | 2002171298 | 6/2002 |
| JP | 2002198938 | 7/2002 |
| JP | 2002217748 | 8/2002 |

OTHER PUBLICATIONS

"$3_{rd}$ Generation Partnership Project; Technical Specification Group Radio Access Network; Multiplexing and Channel Coding (FDD)," 3GPP TS 25.212 V5.0.0 (Mar. 2002), Release 5, pp. 1-74.

* cited by examiner

APPARATUS AND METHOD FOR SEPARATELY MODULATING SYSTEMATIC BITS AND PARITY BITS IN ACCORDANCE WITH COMMUNICATION QUALITY

TECHNICAL FIELD

The present invention relates to a transmission apparatus and transmission method, and more particularly, to a transmission apparatus and transmission method for transmitting transmission data encoded using a turbo encoder.

BACKGROUND ART

Conventionally, a turbo code is available as an error correcting/encoding scheme and used by the 3GPP for standardization. Compared to other error correcting schemes, this turbo code is characterized by its ability to obtain an error rate characteristic of extremely high quality.

An example of a transmission apparatus using a conventional turbo code is shown in FIG. 1. The transmission apparatus 10 shown in FIG. 1 is provided with a turbo encoding section 11, a parallel/serial (hereinafter referred to as "P/S") conversion section 12, a spreading section 13, a radio transmission section 14 and an antenna 15.

A turbo encoding section 11 receives a transmission signal, converts the signal to a turbo code, generates systematic bit data and parity bit data, and gives those data to the P/S conversion section 12. The P/S conversion section 12 receives the systematic bit data and parity bit data from the turbo encoding section 11, carries out P/S modulation, generates a serial modulated signal and gives the signal to the spreading section 13.

The spreading section 13 carries out spreading processing on the modulated signal from the P/S conversion section 12, generated a spread signal and gives the spread signal to the radio transmission section 14. Here, according to the 3GPP (Third Generation Partnership Project) standardization scheme, the spreading section 13 uses the same spreading code for systematic bit data and parity bit data of the modulated signal, and uses the same spreading factor and the same number of spreading codes assigned. The radio transmission section 14 receives the spread signal from the spreading section 13 and sends the signal through the antenna 15.

Here, as a conventional CDMA transmission apparatus, there is one provided with a section that spreads one user signal with a plurality of spread signals assigned thereto to improve the error rate characteristic.

Furthermore, the conventional CDMA transmission apparatus is also provided with a data addition section for converting an input data string with variable bits to a data string XA with a predetermined number of bits, a first encoding section for encoding the data string XA, a second encoding section for encoding a data string XA, after interleaving and two puncturing sections for puncturing the outputs of the first and second encoding sections.

However, the conventional CDMA transmission apparatus has a problem that when a plurality of spread signals is assigned to one user signal for spreading to improve its error rate characteristic, the number of user signals that can be multiplexed is reduced, and therefore the frequency utilization efficiency is reduced and when the spreading factor is increased, the error rate characteristic may be improved but the transmission efficiency decreases. That is, the conventional CDMA transmission apparatus has a problem that it is difficult to make improvement of the error rate characteristic compatible with improvement of the transmission efficiency.

DISCLOSURE OF INVENTION

It is an object of the present invention to provide a transmission apparatus and transmission method capable of making both the error rate characteristic and the transmission efficiency mutually more compatible.

This object is to adaptively modulate the systematic bit data and parity bit data independently of each other. That is, this object can be realized, when channel quality deteriorates, by converting the systematic bit data to a modulation scheme with a small number of multi-values to prevent a reduction of the error rate characteristic, and when an error occurs, by carrying out error correction using parity bits transmitted according to a modulation scheme having more multi-values than the systematic bit data and reducing the number of retransmissions of transmission data.

Furthermore, this object can be attained through a CDMA transmission apparatus which uses turbo codes as error correcting codes by carrying out spreading with a plurality of spreading codes assigned to only systematic bits.

BEST MODE FOR CARRYING OUT THE INVENTION

With reference now to the attached drawings, embodiments of the present invention will be explained in detail below.

Embodiment 1

Figure 1:
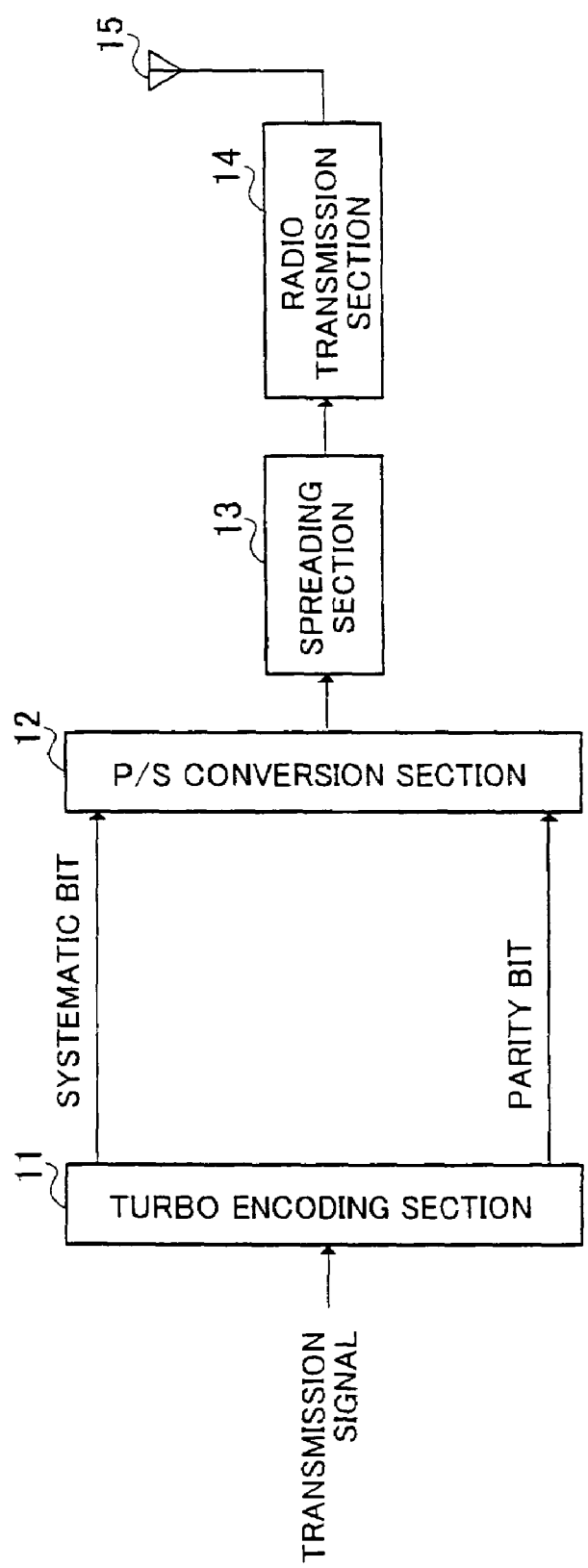
FIG. 1 is a block diagram showing a configuration of a conventional transmission apparatus.
Figure 2:
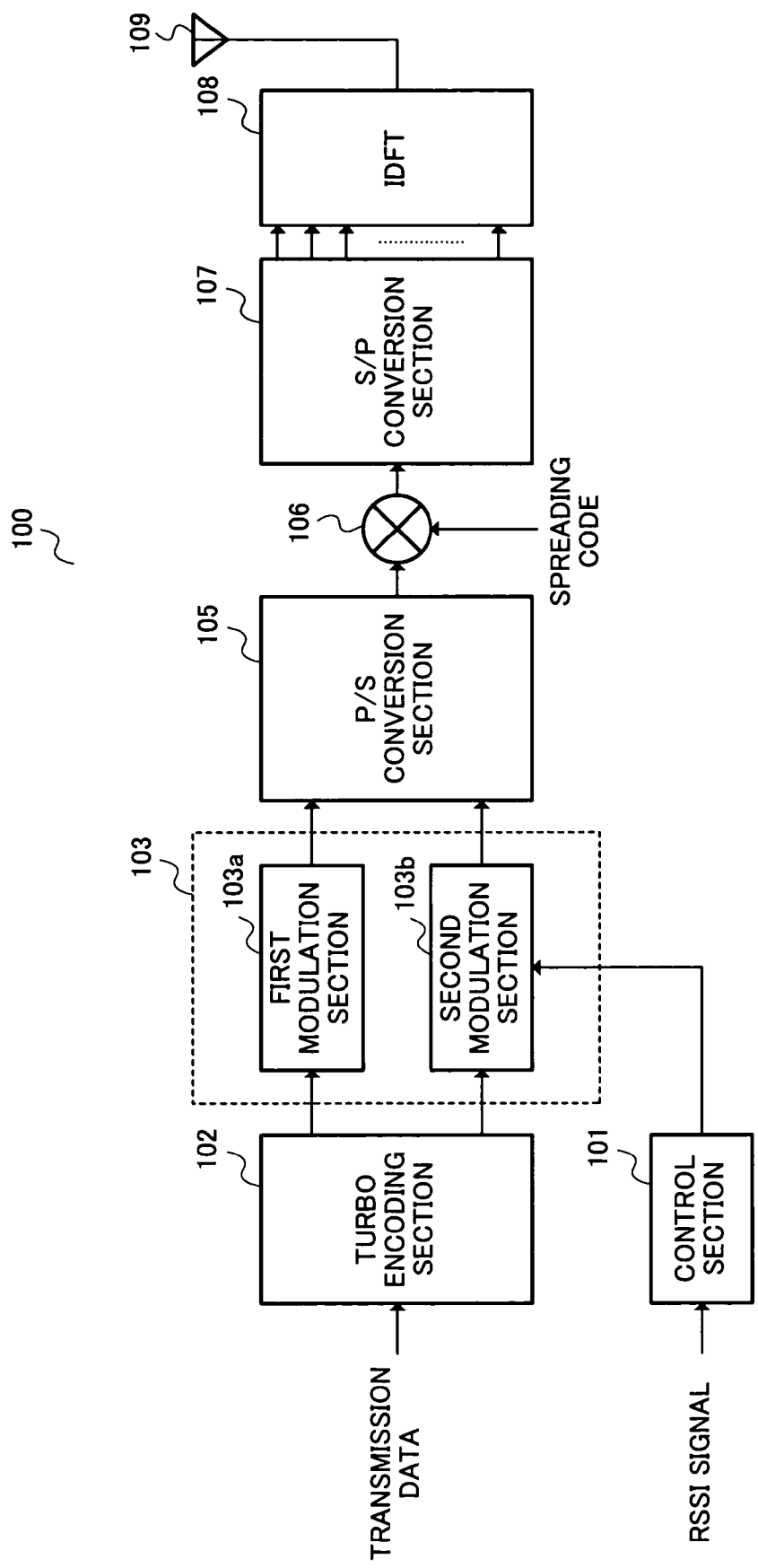
FIG. 2 is a block diagram showing a configuration of a transmission apparatus according to Embodiment 1 of the present invention.

FIG. 2 illustrates a configuration of a transmission apparatus 100 according to Embodiment 1 of the present invention. Here, Embodiment 1 will describe a case where two kinds of modulation schemes, QPSK and 16 QAM are used. Furthermore, the modulation scheme with more multi-values according to Embodiment 1 is 16 QAM and the modulation scheme with fewer multi-values is QPSK.

The transmission apparatus 100 is mainly constructed of a control section 101, a turbo encoding section 102, a modulation section 103, a P/S conversion section 105, a spreader 106, a serial/parallel (hereinafter referred to as "S/P") conversion section 107, an inverse discrete Fourier transform section (IDFT) 108 and an antenna 109. Furthermore, the modulation section 103 is mainly constructed of a first modulation section 103a and a second modulation section 103b.

The control section 101 decides communication quality using an RSSI (Received Signal Strength Indicator) signal, and outputs a control signal according to communication quality to the second modulation section 103b. That is, when the RSSI signal is equal to or higher than a threshold, a control signal for setting the modulation scheme to 16 QAM which is a modulation scheme with more multi-values is output to the second modulation section 103b. On the other hand, when the RSSI signal is less than the threshold, a control signal for setting the modulation scheme to QPSK which is a modulation scheme with fewer multi-values is output to the second modulation section 103b. Now, when a communication is currently in progress, and as a result of a decision in the control section 101, if the currently used modulation scheme is continuously used, the control section 101 does not output any control signal to the second modulation section 103b. Here, the modulation scheme with more multi-values refers to a modulation scheme with many constellation mapping points on an I-Q plane.

The turbo encoding section 102 is, for example, a turbo encoder, and outputs part of the input transmission data to the first modulation section 103a as systematic bit data without encoding the transmission data, and carries out recursive convolutional encoding on part of the remaining transmission data input and outputs it as parity bit data to the second modulation section 103b. Here, the turbo encoding section 102 may also be any encoder other than the turbo encoder. Details of the turbo encoding section 102 will be explained in detail later.

The modulation scheme of the first modulation section 103a is fixed to QPSK, carries out QPSK modulation on the systematic bit data input from the turbo encoding section 102 and outputs the modulated data to the P/S conversion section 105.

The second modulation section 103b carries out adaptive modulation of QPSK modulation or 16 QAM modulation based on the control signal input from the control section 101 on the parity bit data input from the turbo encoding section 102 and outputs the modulated data to the P/S conversion section 105. The method of changing the modulation scheme will be explained later.

The P/S conversion section 105 converts the systematic bit data input from the first modulation section 103a and the parity bit data input from the second modulation section 103b from parallel data to serial data and outputs the serial data to the spreader 106.

The spreader 106 which is the spreading section multiplies the transmission data input from the S/P conversion section 107 by a spreading code and outputs the multiplication result to the S/P conversion section 107. Here, when transmission is carried out according to the OFDM-CDMA communication scheme, a spreading code whose spreading factor is other than "1" is multiplied and when transmission is carried out according to the OFDM communication scheme, a spreading code whose spreading factor is "1" is multiplied.

The S/P conversion section 107 converts the transmission data input from the spreader 106 from serial data to parallel data and outputs the conversion result to the inverse discrete Fourier transform section 108.

The inverse discrete Fourier transform section 108 transforms data into a sum of N (N is an arbitrary natural number) subcarriers with different frequencies to generate transmission data, and sends the transmission data generated from the antenna 109. When transmission is carried out according to the OFDM-CDMA communication scheme, the signal multiplexing number of each subcarrier is a multiplexing number other than "1" and the code multiplexing number of the transmission signal is other than "1" and when transmission is carried out according to the OFDM communication scheme, the signal multiplexing number of each subcarrier is "1" and the code multiplexing number of the transmission signal is "1". Furthermore, the S/P conversion section 107 and inverse discrete Fourier transform section 108 constitute an orthogonal frequency division multiplexing section.

Figure 3:
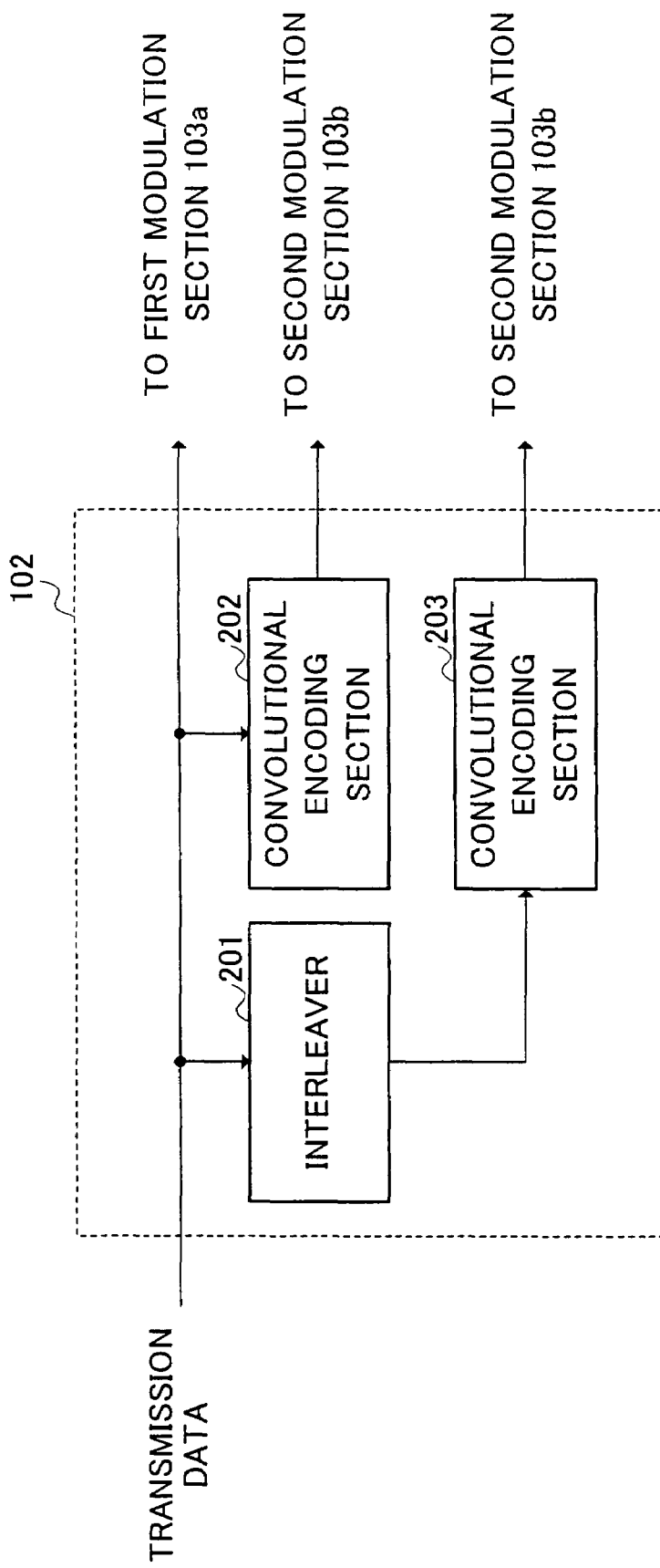
FIG. 3 is a block diagram showing a configuration of an encoding section according to Embodiment 1 of the present invention.

Then, the configuration of the turbo encoding section 102 will be explained in more detail using FIG. 3. The turbo encoding section 102 is mainly constructed of an interleaver 201, a convolutional encoding section 202 and a convolutional encoding section 203.

The interleaver 201 interleaves the transmission data and outputs the interleaved data to the convolutional encoding section 203.

The convolutional encoding section 202 carries out recursive convolutional encoding on part of the transmission data and outputs the data to the second modulation section 103b. The output from the convolutional encoding section 202 is the parity bit data.

The convolutional encoding section 203 carries out recursive convolutional encoding on part of the transmission data input from the interleaver 201 and outputs the data to the second modulation section 103b. The output from the convolutional encoding section 203 is the parity bit data. Here, part of the transmission data input to the turbo encoding section 102 is not encoded and output as is. This output is the systematic bit data.

Figure 4:
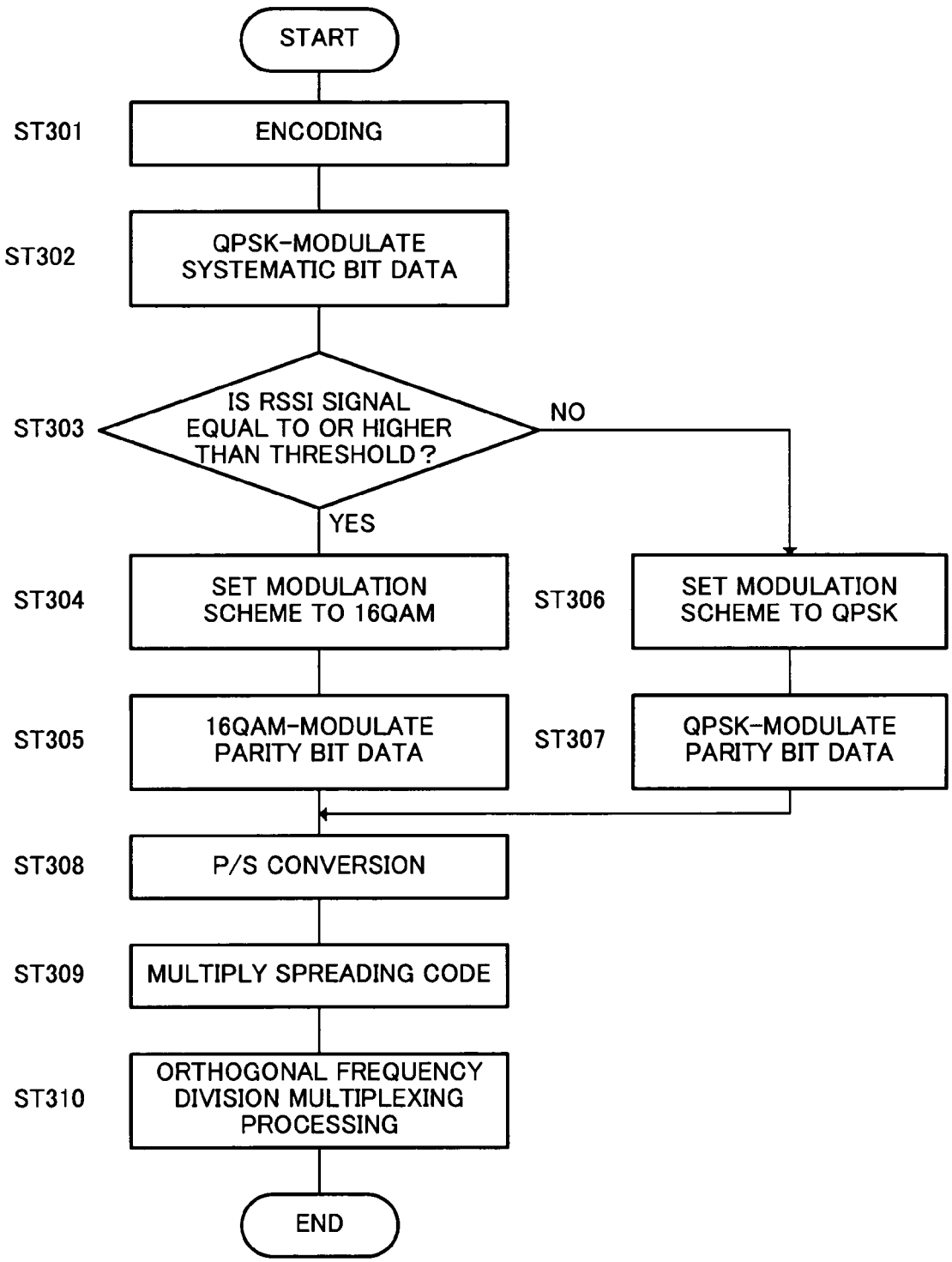
FIG. 4 is a flow chart showing an operation of a transmission apparatus according to Embodiment 1 of the present invention.

Then, the operation of the transmission apparatus 100 will be explained using FIG. 4. The transmission data is encoded by the turbo encoding section 102 (step (hereinafter referred to as "ST") 301), the systematic bit data is output to the first modulation section 103a, and the parity bit data is output to the second modulation section 103b. The systematic bit data input to the first modulation section 103a is QPSK-modulated and output to the P/S conversion section 105 (ST302).

The control section 101 decides whether the RSSI signal is equal to or higher than a threshold based on the RSSI signal (ST303), and when the RSSI signal is equal to or higher than the threshold, the control section 101 decides that the communication quality is good and outputs a control signal for setting the modulation scheme to 16 QAM to the second modulation section 103b. The second modulation section 103b sets the modulation scheme to 16 QAM based on a control signal for setting the modulation scheme input from the control section 101 (ST304). The parity bit data input to the second modulation section 103b is 16 QAM-modulat and output to the P/S conversion section 105 (ST305).

On the other hand, when the RSSI signal is less than the threshold in ST303, the control section 101 outputs a control signal for setting the modulation scheme to QPSK to the second modulation section 103b. The second modulation section 103b sets the modulation scheme to QPSK based on the control signal for setting the modulation scheme input from the control section 101 (ST306). The parity bit data input to the second modulation section 103b is QPSK-modulated and output to the P/S conversion section 105 (ST307). The P/S conversion section 105 converts the systematic bit data and parity bit data from parallel data to serial data and output the serial data to the spreader 106 (ST308). Then, the transmission data is multiplied by a spreading code by the spreader 106 (ST309), further subjected to S/P conversion processing which is orthogonal frequency division multiplexing processing and inverse discrete Fourier transform processing and output from the antenna 109 (ST310).

When the channel quality deteriorates in such a transmission apparatus, deterioration of the error rate characteristic of the systematic bit data is prevented by setting a modulation scheme with fewer multi-values, and if an error still occurs, error correction can be performed according to a modulation scheme with more multi-values than the systematic bit data and the number of retransmissions of transmission data is reduced.

On the other hand, when the channel quality is good, the error rate characteristic can be improved by setting the systematic bit data to a modulation scheme with more multi-values and if an error still occurs, error correction can be performed using parity bits transmitted according to a modulation scheme at such a level that there are fewer multi-values than the systematic bit data but the error rate characteristic does not deteriorate, and the number of retransmissions of the transmission data is reduced.

Thus, according to Embodiment 1, systematic bit data and parity bit data are modulated independently of each other and the modulation scheme of the parity bit data is adaptively changed according to the communication quality, and it is therefore possible to make improvement of the error rate characteristic compatible with improvement of the transmission efficiency. Furthermore, independently modulated systematic bit data and parity bit data are subjected to spreading processing and then subjected to orthogonal frequency division multiplexing, and therefore it is possible to further improve the error rate characteristic of the transmission data.

According to Embodiment 1, only parity bit data is adaptively modulated according to communication quality, but the embodiment can also be adapted so that only systematic bit data is adaptively modulated according to communication quality.

Embodiment 2

Figure 5:
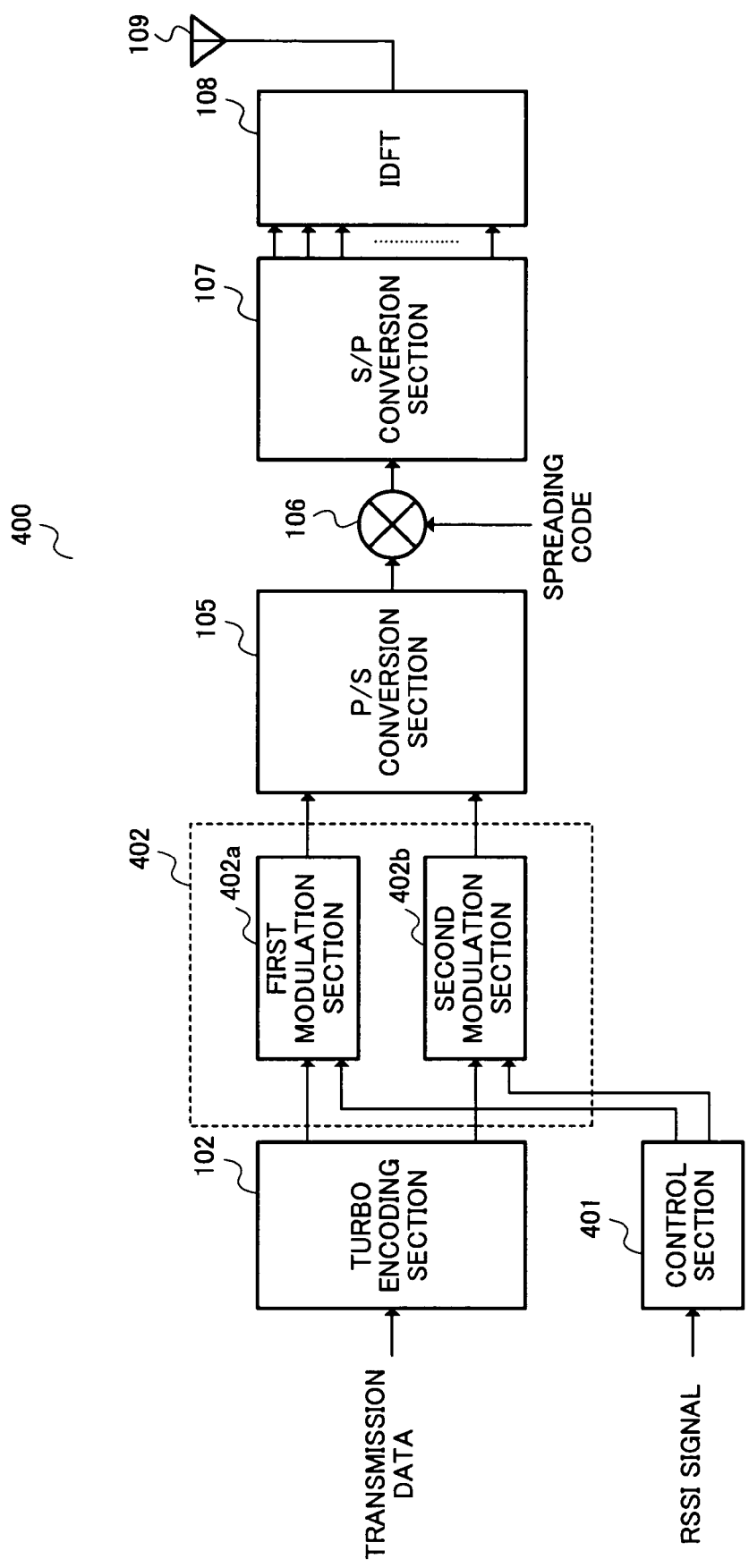
FIG. 5 is a block diagram showing a configuration of a transmission apparatus according to Embodiment 2 of the present invention.

FIG. 5 illustrates a configuration of a transmission apparatus 400 according to Embodiment 2 of the present invention. Here, this Embodiment 2 will describe a case where two types of modulation schemes; QPSK and 16 QAM are used. Furthermore, in this Embodiment 2, the modulation scheme with more multi-values is 16 QAM and the modulation scheme with fewer multi-values is QPSK.

A modulation section 402 in this Embodiment 2 is mainly constructed of a first modulation section 402a and a second modulation section 402b. This Embodiment 2 is characterized in that the modulation schemes in both the first modulation section 402a and second modulation section 402b are adaptively modulated according to communication quality. Note that this embodiment is different from FIG. 2 in that a control signal from the control section 401 is input to the first modulation section 402a, and explanations of the same components as those in Embodiment 1 will be omitted.

The control section 401 decides communication quality using an RSSI signal and outputs a control signal according to the communication quality to the first modulation section 402a and second modulation section 402b. When setting a modulation scheme, the control section 401 uses two types of thresholds, threshold $\alpha$ for setting a modulation scheme when modulating systematic bit data and threshold $\beta$ for setting a modulation scheme for modulating parity bit data. That is, when the RSSI signal is equal to or higher than the threshold $\alpha$, a control signal for setting the modulation scheme to 16 QAM which is a modulation scheme with more multi-values is output to the first modulation section 402a and when the RSSI signal is equal to or higher than the threshold $\beta$, a control signal for setting the modulation scheme to 16 QAM which is a modulation scheme with more multi-values is output to the second modulation section 402b.

On the other hand, when the RSSI signal is less than the threshold $\alpha$, the control section 401 outputs a control signal for setting the modulation scheme to QPSK which is a modulation scheme with fewer multi-values to the first modulation section 402a and when the RSSI signal is less than the threshold $\beta$, the control section 401 outputs a control signal for setting the modulation scheme to QPSK which is a modulation scheme with fewer multi-values to the second modulation section 402b. Here, when a communication is currently in progress and a decision result by the control section 401 shows that the currently used modulation scheme continues to be used, the control section 401 need not output any control signal to the outputs of the first modulation section 402a and second modulation section 402b. The configuration of the control section 401 will be explained in more detail later.

Based on the control signal input from the control section 401, the first modulation section 402a carries out QPSK modulation or 16 QAM modulation on the systematic bit data input from the turbo encoding section 102 and outputs the modulated data to the P/S conversion section 105.

Based on the control signal input from the control section 401, the second modulation section 402b carries out adaptive modulation such as QPSK modulation or 16 QAM modulation on the parity bit data input from the turbo encoding section 102, and outputs the modulated data to the P/S conversion section 105. The method of changing the modulation scheme will be described later.

Figure 6:
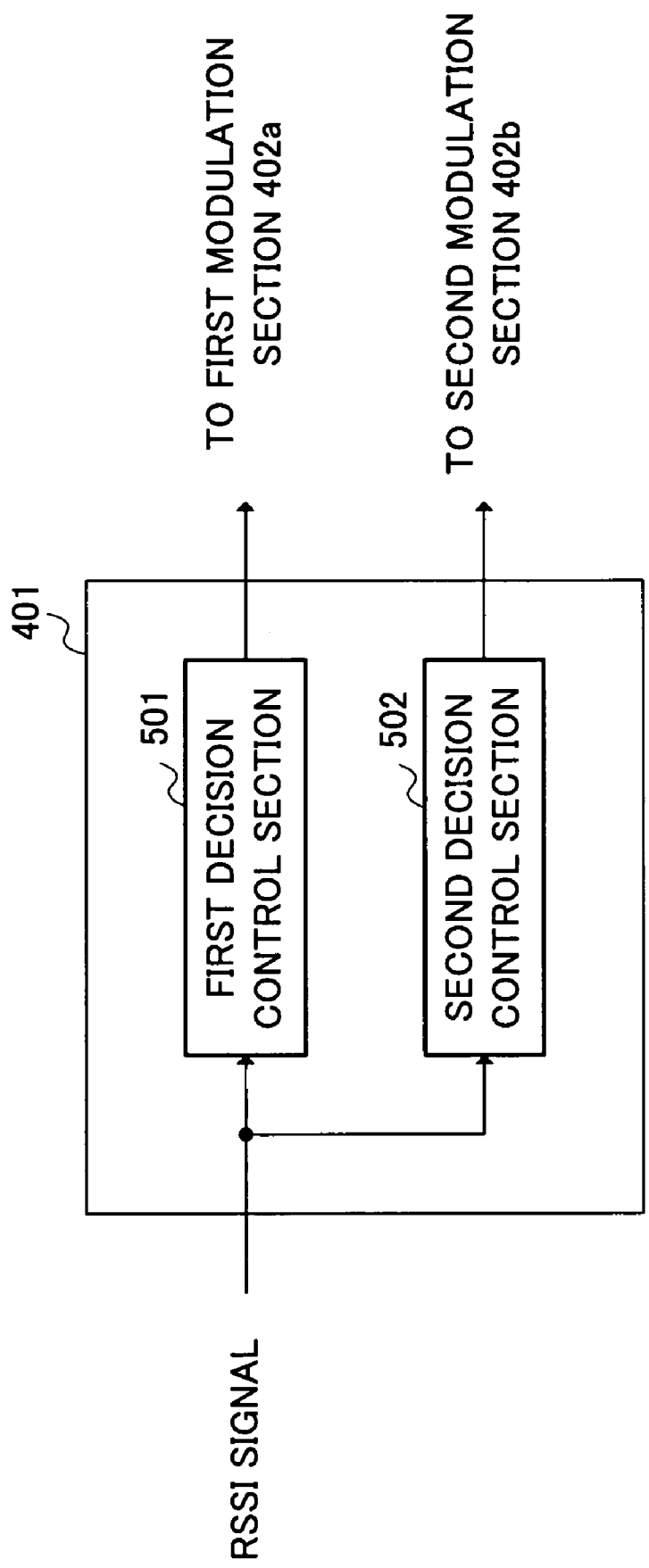
FIG. 6 is a block diagram showing a configuration of a control section according to Embodiment 2 of the present invention.

Then, the configuration of the control section 401 will be explained in more detail using FIG. 6. The control section 401 is mainly constructed of a first decision control section 501 and a second decision control section 502.

When the RSSI signal is equal to or higher than a preset threshold $\alpha$, the first decision control section 501 outputs a control signal for setting the modulation scheme to 16 QAM to the first modulation section 402. On the other hand, when the RSSI signal is less than the threshold $\alpha$, the first decision control section 501 outputs a control signal for setting the modulation scheme to QPSK to the first modulation section 402a.

When the RSSI signal is equal to or higher than a preset thresholds $\beta$, the second decision control section 502 outputs a control signal for setting the modulation scheme to 16

QAM to the first modulation section 402. On the other hand, when the RSSI signal is less than the threshold β, the second decision control section 502 outputs a control signal for setting the modulation scheme to QPSK to the second modulation section 402b.

Since systematic bit data is required to have better communication quality than parity bit data, the threshold α is set to a higher RSSI value than the threshold β. In this way, systematic bit data is always modulated according to the same modulation scheme as that of parity bit data or according to the modulation scheme with fewer multi-values than the modulation scheme of parity bit data.

Figure 7:
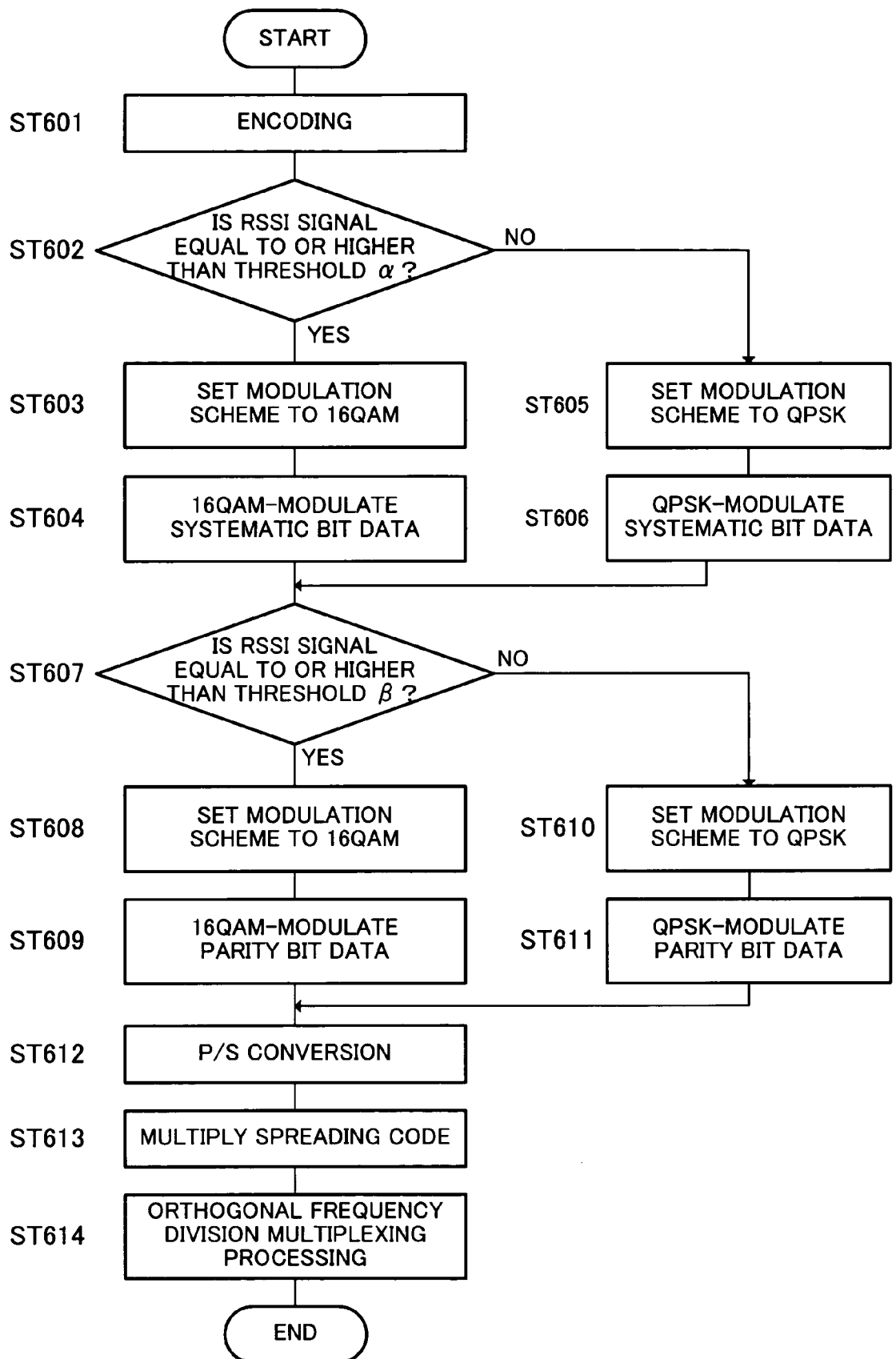
FIG. 7 is a flow chart showing operation of a transmission apparatus according to Embodiment 2 of the present invention.

Then, the operation of the transmission apparatus 400 will be explained using FIG. 7. The transmission data is encoded by the turbo encoding section 102 (ST601), systematic bit data is output to the first modulation section 402a and parity bit data is output to the second modulation section 402b.

Based on the RSSI signal, the control section 401 decides whether the RSSI signal is equal to or higher than threshold α (ST602), and when the RSSI signal is equal to or higher than the threshold α, the control section 401 considers that the communication quality is good and outputs a control signal for setting the modulation scheme to 16 QAM to the first modulation section 402a. Based on a control signal for setting the modulation scheme input from the control section 401, the first modulation section 402a sets the modulation scheme to 16 QAM (ST603). The systematic bit data input to the first modulation section 402a is 16 QAM-modulated and output to the P/S conversion section 105 (ST604).

On the other hand, in ST602, when the RSSI signal is less than the threshold α, the control section 401 outputs a control signal for setting the modulation scheme to QPSK. Based on a control signal for setting the modulation scheme input from the control section 401, the first modulation section 402a sets the modulation scheme to QPSK (ST605). The systematic bit data input to the second modulation section 402b is QPSK-modulated and output to the P/S conversion section 105 (ST606).

Then, based on the RSSI signal, the control section 401 decides whether the RSSI signal is equal to or higher than the threshold β or not (ST607), and when the RSSI signal is equal to or higher than the threshold β, the control section 401 considers that the communication quality is good and outputs a control signal for setting the modulation scheme to 16 QAM to the second modulation section 402b. Based on a control signal for setting the modulation scheme input from the control section 401, the second modulation section 402b sets the modulation scheme to 16 QAM (ST608). The parity bit data input to the second modulation section 402b is 16 QAM-modulated and output to the P/S conversion section 105 (ST609).

On the other hand, in ST607, when the RSSI signal is less than the threshold β, the control section 401 outputs a control signal for setting the modulation scheme to QPSK to the second modulation section 402b. Based on a control signal for setting the modulation scheme input from the control section 401, the second modulation section 402b sets the modulation scheme to QPSK (ST610) The parity bit data input to the second modulation section 402b is QPSK-modulated and output to the P/S conversion section 105 (ST611). The P/S conversion section 105 converts the systematic bit data and parity bit data from parallel to serial and outputs the serial data to the spreader 106 (ST612). Then, the transmission data is multiplied by a spreading code by the spreader 106 (ST613), and further subjected to S/P conversion processing which is orthogonal frequency division multiplexing processing, and subjected to inverse discrete Fourier transform processing and sent from the antenna 109 (ST614).

Thus, according to Embodiment 2, systematic bit data is adaptively modulated according to communication quality in addition to the effects in Embodiment 1, and it is therefore possible to further make improvement of the error rate characteristic compatible with improvement of transmission efficiency. Furthermore, according to Embodiment 2, the control section 401 compares the RSSI signal with different thresholds for systematic bit data and parity bit data, and therefore it is possible to make improvement of the error rate characteristic compatible with improvement of transmission efficiency by flexibly responding to changes in communication quality.

This Embodiment 2 uses different thresholds α and β to be used when deciding whether communication quality is equal to or higher than that of an RSSI signal, but it is also possible to set the same value for the threshold α and threshold β or set the threshold α to a value smaller than the threshold β.

Embodiment 3

Figure 8:
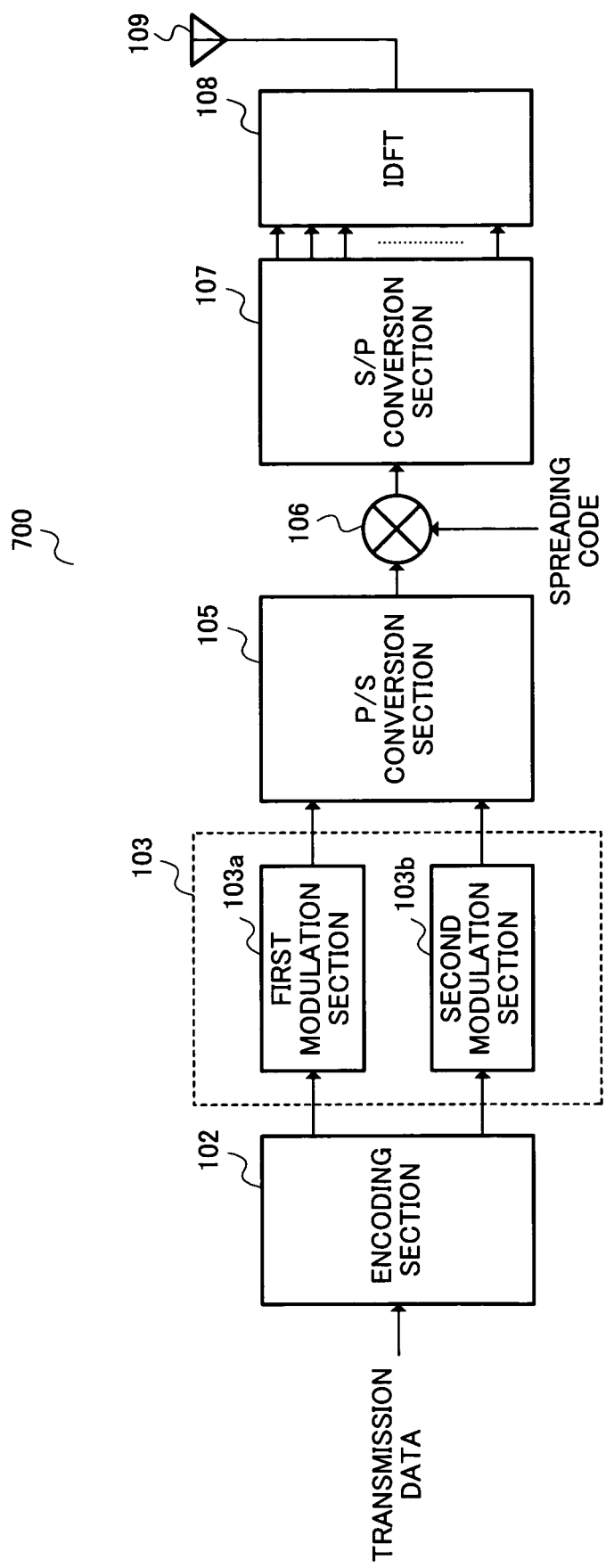
FIG. 8 is a block diagram showing a configuration of a transmission apparatus according to Embodiment 3 of the present invention.

FIG. 8 illustrates a configuration of a transmission apparatus 700 according to Embodiment 3 of the present invention. Here, when two types of modulation schemes QPSK and 16 QAM are used in Embodiment 3, a case where QPSK is used as a modulation scheme with fewer multi-values will be explained. In this Embodiment 3, the modulation scheme with more multi-values is 16 QAM and the modulation scheme with fewer multi-values is QPSK.

This Embodiment 3 is characterized in that while transmission data (other data) for which good reception quality is not required is modulated according to 16 QAM with more multi-values, when transmitting transmission data for which good reception quality is required, the modulation schemes for both the first modulation section 103a and second modulation section 103b are always set to QPSK which is a modulation scheme with fewer multi-values. Here, the same components as those in FIG. 2 are assigned the same reference numerals and explanations thereof will be omitted.

The first modulation section 103a modulates the transmission data according to QPSK and outputs the modulated data to the P/S conversion section 105.

The second modulation section 103b modulates the transmission data according to QPSK and outputs the modulated data to the P/S conversion section 105.

The transmission data according to this embodiment requires good communication quality such as control information and retransmission information. The transmission data is not limited to control information and retransmission information, but includes that for which good communication quality is required.

Thus, according to this Embodiment 3, the systematic bit data and parity bit data are modulated independently of each other and the modulation scheme is fixed to a modulation scheme with fewer multi-values, and therefore when the transmission data is required to have good communication quality such as control information and retransmission information, it is possible to make improvement of the error rate characteristic compatible with improvement of the transmission efficiency. Furthermore, the independently modulated systematic bit data and parity bit data are subjected to spreading processing and then subjected to orthogonal frequency division multiplexing, and therefore it is possible to further improve an error rate characteristic of transmission data.

In this Embodiment 3, the modulation scheme is set to QPSK, but the modulation scheme is not limited to QPSK and any modulation scheme other than QPSK can be used if it has at least fewer multi-values. Furthermore, according to this Embodiment 3, both the first modulation section 103*a* and second modulation section 103*b* are modulated according to QPSK, but they need not always be set to the same modulation scheme and the first modulation section 103*a* and second modulation section 103*b* can be set to different modulation schemes.

Note that since systematic bit data is required to have better communication quality than parity bit data, if 16 QAM is used as the modulation scheme for both systematic bit data and parity bit data, a method of carrying out processing that the systematic bit data is arranged on polarity bits is also available. This allows the systematic bit data to obtain a good error rate characteristic.

However, the quality of the 16 QAM polarity bits is inferior to the quality of QPSK, and therefore even if the systematic bit is arranged on polarity bits, the error rate characteristic deteriorates compared to Embodiment 1 and Embodiment 2. Furthermore, the processing of arranging systematic bits on polarity bits requires special processing of dividing the transmission data into two systems and arranging those data on the 16 QAM polarity bits and amplification bits, and therefore the processing is more complicated than that in Embodiment 1 and Embodiment 2. Furthermore, the processing of arranging systematic bits on polarity bits cannot be performed with 8 PSK, QPSK and BPSK, but there is no restriction on the modulation schemes in the cases of Embodiment 1 and Embodiment 2.

Embodiment 4

Figure 9:
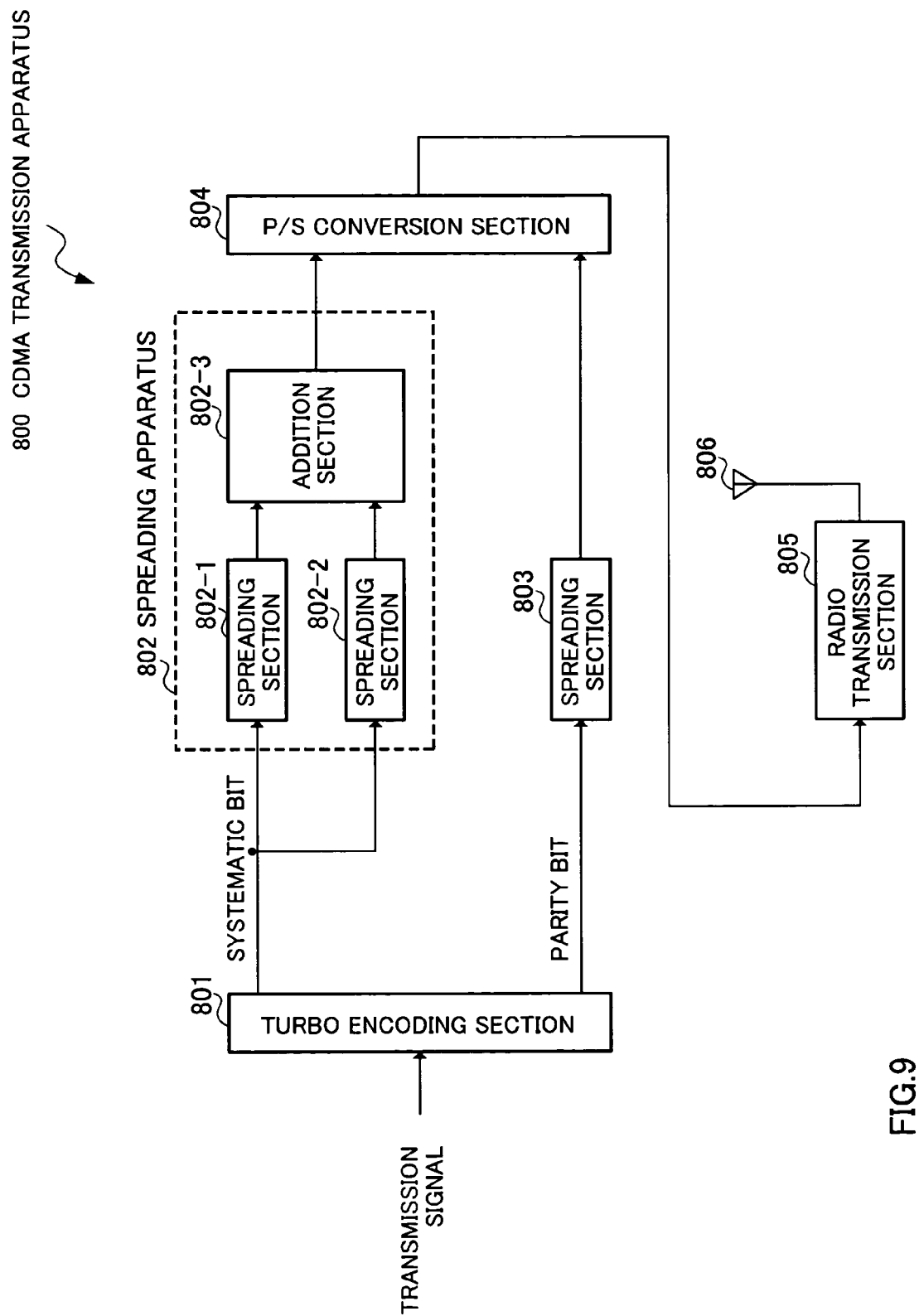
FIG. 9 is a block diagram showing a configuration of a transmission apparatus according to Embodiment 4 of the present invention.

FIG. 9 is a block diagram showing a configuration of a transmission apparatus according to Embodiment 4 of the present invention.

As shown in FIG. 9, the transmission apparatus 800 according to Embodiment 4 of the present invention is provided with a turbo encoding section 801, a spreading apparatus 802, a spreading section 803, a parallel/serial (P/S) conversion section 804, a radio transmission section 805 and an antenna 806. The spreading apparatus 802 includes a plurality of spreading sections 802-1, 802-2 and an addition section 802-3.

The input terminals of the spreading sections 802-1, 802-2 and spreading section 803 are connected to the output terminals of the turbo encoding section 801. The input terminals of the addition section 802-3 are connected to the output terminals of the spreading sections 802-1, 802-2. The input terminals of the parallel/serial conversion section 804 are connected to the output terminals of the addition section 802-3 and spreading section 803. The input terminal of the radio transmission section 805 is connected to the output terminal of the parallel/serial conversion section 804. The input terminal of the antenna 806 is connected to the output terminal of the radio transmission section 805.

The turbo encoding section 801 receives a transmission signal, converts the signal to a turbo code, generates systematic bit data and parity bit data, gives the systematic bit data to the spreading sections 802-1, 802-2 and gives the parity bit data to the spreading section 803.

The spreading apparatus 802 assigns a plurality of different spreading codes to the systematic bit data from the turbo encoding section 801, spreads the systematic bit data, multiplexes the spread systematic bit data and gives the multiplexed systematic bit data to the parallel/serial conversion section 804.

That is, the spreading sections 802-1, 802-2 assign different spreading codes to the systematic bit data from the turbo encoding section 801, spread the systematic bit data and give the spread systematic bit data to the addition section 802-3. The addition section 802-3 receives the spread systematic bit data from the spreading sections 802-1, 802-2, multiplexes the data and gives the multiplexed systematic bit data to the parallel/serial conversion section 804.

Furthermore, the spreading section 803 receives the parity bit data from the turbo encoding section 801, spreads the parity bit data with one spreading code assigned thereto and gives the spread parity bit data to the P/S conversion section 804.

The P/S conversion section 804 modulates the systematic bit data from the addition section 802-3 and the parity bit data from the spreading section 803 into one serial modulated signal and sends the modulated signal to the radio transmission section 805. The radio transmission section 805 receives the modulated signal from the P/S conversion section 804 and sends the modulated signal through the antenna 806.

Embodiment 4 of the present invention may also be adapted so that the spreading apparatus 802 spreads the systematic bit data with three or more different spreading codes assigned to the systematic bit data, multiplexes the spread systematic bit data and gives the spread systematic bit data to the P/S conversion section 804. Furthermore, in Embodiment 1 of the present invention, the number of spreading codes of the spreading apparatus 802 may be made variable based on the channel quality (e.g., RSSI) and multipath delay distribution time information. Furthermore, in Embodiment 4 of the present invention, it is also possible to assign a plurality of spreading codes to parity bit data or make a plurality of spreading codes of parity bit data variable or make the plural number of spreading codes of parity bit data variable based on channel quality (e.g., RSSI) and multipath delay distribution time information.

Thus, according to Embodiment 4 of the present invention, since more spreading codes are assigned to systematic bit data which is required to have good channel quality than spreading codes assigned to parity bit data whose channel quality can be low, it is possible to make improvement of the error rate characteristic compatible with improvement of the transmission efficiency.

Embodiment 5

Figure 10:
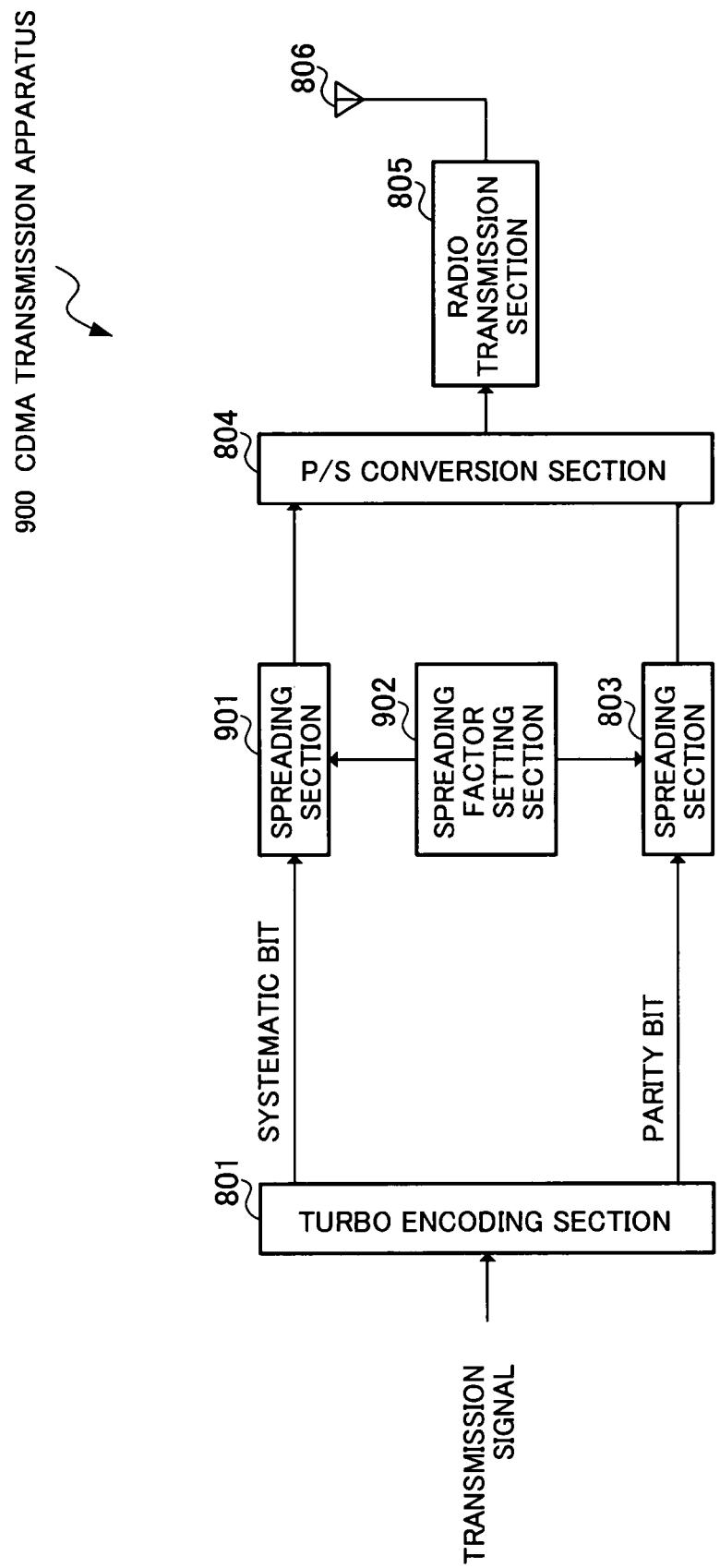
FIG. 10 is a block diagram showing a configuration of a transmission apparatus according to Embodiment 5 of the present invention.

Embodiment 5 of the present invention will be explained in detail with reference to the attached drawings. FIG. 10 is a block diagram showing a configuration of a transmission apparatus according to Embodiment 5 of the present invention. In Embodiment 5 of the present invention, the same components as those in Embodiment 4 of the present invention are assigned the same reference numerals and explanations thereof will be omitted.

As shown in FIG. 10, a transmission apparatus 900 according to Embodiment 5 of the present invention is provided with a turbo encoding section 801, a spreading section 901, a spreading section 803, a spreading factor setting section 902, a parallel/serial conversion section 804, a radio transmission section 805 and an antenna 806.

The input terminal of spreading section 901 is connected to the output terminal of the turbo encoding section 801. The output terminal of the spreading section 901 is connected to the input terminal of the P/S conversion section 804. The output terminals of the spreading factor setting section 902 are connected to the control terminals of the spreading section 803 and spreading section 901. The spreading factor setting section 902 sets a first spreading factor and a second spreading factor which is greater than the first spreading factor, gives the first spreading factor to the spreading section 803 and gives the second spreading factor to the spreading section 901.

The turbo encoding section 801 receives a transmission signal, transforms it to a turbo code, generates a systematic bit data and parity bit data, gives the systematic bit data to the spreading section 901 and gives the parity bit data to the spreading section 803.

The spreading section 803 receives the parity bit data from the turbo encoding section 801, spreads the parity bit data with one spreading code assigned thereto and gives the spread parity bit data to the P/S conversion section 804.

Furthermore, the spreading section 901 assigns one spreading code to the systematic bit data from the turbo encoding section 801, spreads the systematic bit data using the second spreading factor and gives the spread systematic bit data to the P/S conversion section 804.

Embodiment 5 of the present invention can also be adapted so that the spreading apparatus 802 shown in FIG. 9 is provided instead of the spreading section 901, a plurality of spreading factors greater than the first spreading factor is given to the spreading sections 802-1, 802-2 of the spreading apparatus 802 and the systematic bit data is spread using the plurality of spreading factors with a plurality of spreading codes assigned thereto.

Furthermore, in Embodiment 5 of the present invention, the spreading factors of the spreading sections 803, 901 can also be made variable based on the channel quality (e.g., RSSI) and multipath delay distribution time information. Furthermore, either one of the spreading factors of the spreading sections 803, 901 may also be made adaptively variable. Furthermore, in Embodiment 5 of the present invention, the parity bit data may also be spread with a plurality of spreading factors, and the plurality of spreading factors of parity bit data may also be made variable and the plurality of spreading factors of parity bit data may also be made variable based on channel quality (e.g., RSSI) and multipath delay distribution time information.

Thus, according to Embodiment 5 of the present invention, the spreading factor of systematic bit data which is required to have good channel quality is set to a value greater than the spreading factor of parity bit data, and therefore it is possible to make improvement of the error rate characteristic compatible with improvement of the transmission efficiency.

Embodiment 6

Figure 11:
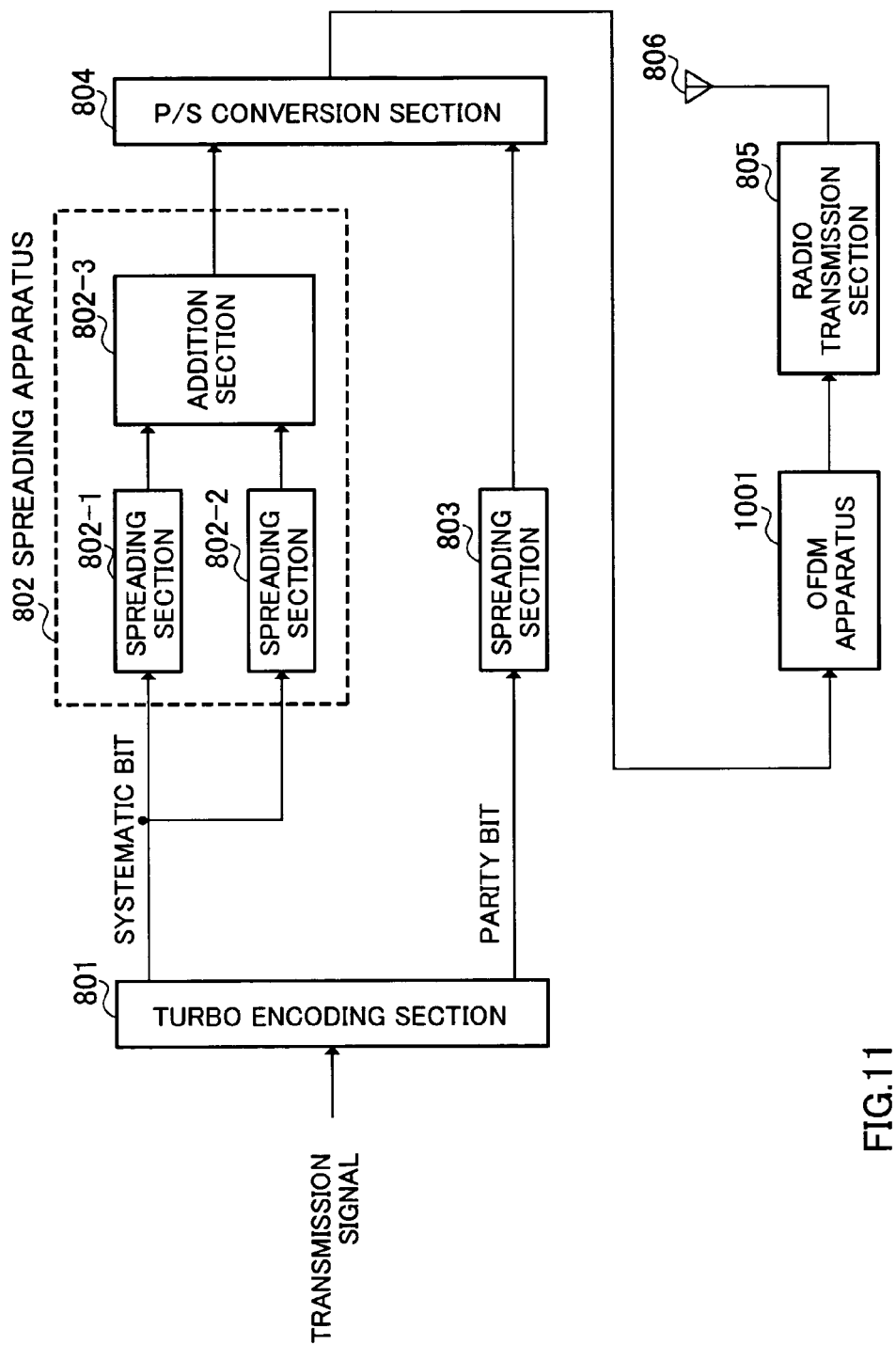
FIG. 11 is a block diagram showing a configuration of a transmission apparatus according to Embodiment 6 of the present invention.

Then, Embodiment 6 of the present invention will be explained in detail with reference to the attached drawings. FIG. 11 is a block diagram showing a configuration of a transmission apparatus according to Embodiment 6 of the present invention. FIG. 11 illustrates the operation of the transmission apparatus according to Embodiment 6 of the present invention. In Embodiment 6 of the present invention, the same components as those in Embodiment 4 of the present invention are assigned the same reference numerals and explanations thereof will be omitted.

As shown in FIG. 11, the transmission apparatus 1000 according to Embodiment 6 of the present invention is constructed of the transmission apparatus 800 according to Embodiment 4 of the present invention with an orthogonal frequency division multiplexing apparatus 1001 added.

That is, the transmission apparatus 1000 according to Embodiment 6 of the present invention is provided with a turbo encoding section 801, a spreading apparatus 802, a spreading section 803, a parallel/serial conversion section 804, an orthogonal frequency division multiplexing (OFDM) apparatus 1001, a radio transmission section 805 and an antenna 806. The spreading apparatus 802 is provided with a plurality of spreading sections 802-1, 802-2 and an addition section 802-3.

The input terminal of the orthogonal frequency division multiplexing apparatus 1001 is connected to the output terminal of the P/S conversion section 804. The output terminal of the orthogonal frequency division multiplexing apparatus 1001 is connected to the input terminal of the radio transmission section 805.

The orthogonal frequency division multiplexing apparatus 1001 receives a modulated signal from the P/S conversion section 804, applies orthogonal frequency division multiplexing thereto, generates an OFDM-CDMA signal and gives the signal to the radio transmission section 805. The radio transmission section 805 receives the OFDM-CDMA signal from the orthogonal frequency division multiplexing apparatus 1001 and sends the signal through the antenna 806.

Figure 12:
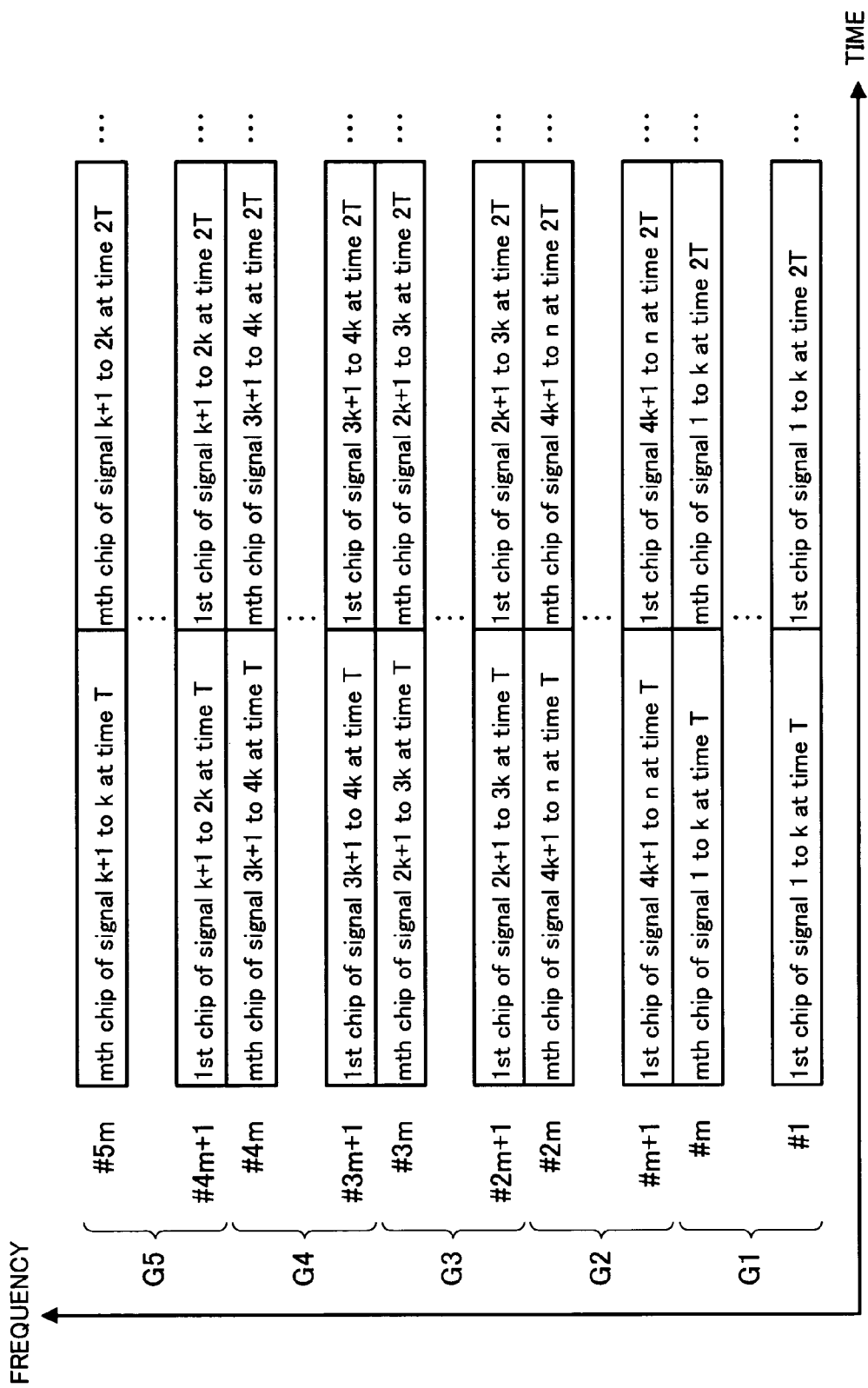
FIG. 12 illustrates operation of a transmission apparatus according to Embodiment 6 of the present invention.

The orthogonal frequency division multiplexing apparatus 1001 sets a spreading ratio to, for example, as shown in FIG. 12, ⅕ of the number of subcarriers, divides all subcarriers into five groups G1 to G5 and arranges systematic bit data and parity bit data of modulated signals from the parallel/serial conversion section 104 on subcarriers of the respective groups G1 to G5. In this case, the parallel/serial conversion section 804 rearranges the modulated signals into a subcarrier configuration as shown in FIG. 12. Note that the spreading ratio is not limited to ⅕ of the number of subcarriers, but can be any value. Furthermore, the spreading ratio of each group of subcarriers need not always be the same, but can be set to any value.

Thus, in addition to the effects of Embodiment 4, Embodiment 6 of the present invention provides a communication scheme combining a CDMA communication scheme and multicarrier communication scheme (including OFDM scheme) (generally called "multicarrier CDMA scheme") whereby the signal multiplexing number is individually set for each subcarrier for which the number of spreading codes assigned to user signals to be retransmitted is increased as the number of retransmissions increases, and can thereby prevent the number of retransmissions from excessively increasing in a multipath environment.

Furthermore, according to Embodiment 6 of the present invention, the multicarrier CDMA scheme can remove interference between neighboring codes in a multipath environment by guard sections, and can thereby drastically improve the error rate in a multipath environment compared to the CDMA scheme and further prevent the number of retransmissions from increasing.

According to Embodiment 1 and Embodiment 2, adaptive modulation is carried out using 16 QAM and QPSK, but adaptive modulation is not limited to 16 QAM and QPSK and adaptive modulation can also be carried out using modulation schemes other than 16 QAM and QPSK such as 8 PSK and BPSK. Furthermore, in Embodiment 1 and Embodiment 2, the systematic bit data is modulated by the first modulation section and parity bit data is modulated by the second modulation section, but the present invention is not limited to this and can be adapted so that one modulation section modulates the systematic bit and parity bit. Furthermore, in Embodiment 1 and Embodiment 2, communication quality is decided based on an RSSI signal, but the present invention is not limited to this and if there are signals, etc., other than the RSSI signal whereby communication quality can be decided, the present invention can also be adapted so that communication quality is decided by signals, etc., other than the RSSI signal. Furthermore, the transmission apparatus and transmission method according to Embodiment 1 to Embodiment 6 are applicable to any communication schemes such as CDMA, OFDM, OFDM-CDMA, multicarrier CDMA and single carrier. Furthermore, the transmission apparatus and transmission method according to Embodiment 1 to Embodiment 6 are applicable to a base station apparatus and communication terminal apparatus.

As described above, the present invention can further make the error rate characteristic compatible with the transmission efficiency.

This application is based on the Japanese Patent Application No. 2002-317728 filed on Oct. 31, 2002 and the Japanese Patent Application No. 2002-350026 filed on Dec. 2, 2002, entire content of which is expressly incorporated by reference herein.

INDUSTRIAL APPLICABILITY

The present invention relates to a transmission apparatus and a transmission method and is preferably applicable to a transmission apparatus and a transmission method which transmits transmission data encoded using a turbo encoder in particular.

[FIG. 1]

TRANSMISSION SIGNAL
11 TURBO ENCODING SECTION
SYSTEMATIC BIT
PARITY BIT
12 P/S CONVERSION SECTION
10 CDMA TRANSMISSION APPARATUS
14 RADIO TRANSMISSION SECTION

[FIG. 2]

TRANSMISSION DATA
102 TURBO ENCODING SECTION
RSSI SIGNAL
101 CONTROL SECTION
103a FIRST MODULATION SECTION
103b SECOND MODULATION SECTION
105 P/S CONVERSION SECTION
SPREADING CODE
107 S/P CONVERSION SECTION

[FIG. 3]

TRANSMISSION DATA
201 INTERLEAVER
202 CONVOLUTIONAL ENCODING SECTION
203 CONVOLUTIONAL ENCODING SECTION
TO FIRST MODULATION SECTION 103a
TO SECOND MODULATION SECTION 103b
TO SECOND MODULATION SECTION 103b

[FIG. 4]

START
ST301 ENCODING
ST302 QPSK-MODULATE SYSTEMATIC BIT DATA
ST303 IS RSSI SIGNAL EQUAL TO OR HIGHER THAN THRESHOLD?
ST304 SET MODULATION SCHEME TO 16QAM
ST306 SET MODULATION SCHEME TO QPSK
ST307 QPSK-MODULATE PARITY BIT DATA
ST308 P/S CONVERSION
ST309 MULTIPLY SPREADING CODE
ST310 ORTHOGONAL FREQUENCY DIVISION MUSTIPLEXING
PROCESSING
END

[FIG. 5]

TRANSMISSION DATA
102 TURBO ENCODING SECTION
RSSI SIGNAL
401 CONTROL SECTION
402a FIRST MODULATION SECTION
402b SECOND MODULATION SECTION
105 P/S CONVERSION SECTION
SPREADING CODE
107 S/P CONVERSION SECTION

[FIG. 6]

RSSI SIGNAL
501 FIRST DECISION CONTROL SECTION
502 SECOND DECISION CONTROL SECTION
TO FIRST MODULATION SECTION 402a
TO SECOND MODULATION SECTION 402b

[FIG. 7]

START
ST601 ENCODING
ST602 IS RSSI SIGNAL EQUAL TO OR HIGHER THAN THRESHOLD $\alpha$?
ST603 SET MODULATION SCHEME TO 16QAM
ST605 SET MODULATION SCHEME TO QPSK
ST604 16QAM-MODULATE SYSTEMATIC BIT DATA
ST606 QPSK-MODULATE SYSTEMATIC BIT DATA
ST607 IS RSSI SIGNAL EQUAL TO OR HIGHER THAN THRESHOLD $\beta$?
ST608 SET MODULATION SCHEME TO 16QAM
ST610 SET MODULATION SCHEME TO QPSK
ST609 16QPSK-MODULATE PARITY BIT DATA
ST611 QPSK-MODULATE PARITY BIT DATA
ST612 P/S CONVERSION

ST613 MULTIPLY SPREADING CODE

ST614 ORTHOGONAL FREQUENCY DIVISION MULTIPLEXING

PROCESSING

END

[FIG. 8]

TRANSMISSION DATA
102 ENCODING SECTION
103a FIRST MODULATION SECTION
103b SECOND MODULATION SECTION
105 P/S CONVERSION SECTION

SPREADING CODE
107 S/P CONVERSION SECTION

[FIG. 9]

TRANSMISSION SIGNAL
801 TURBO ENCODING SECTION

SYSTEMATIC BIT

PARITY BIT
802 SPREADING APPARATUS
802-1 SPREADING SECTION
802-2 SPREADING SECTION
802-3 ADDITION SECTION
803 SPREADING SECTION
804 P/S CONVERSION SECTION
800 CDMA TRANSMISSION APPARATUS
805 RADIO TRANSMISSION SECTION

[FIG. 10]

TRANSMISSION SIGNAL
801 TURBO ENCODING SECTION

SYSTEMATIC BIT

PARITY BIT
901 SPREADING SECTION
902 SPREADING FACTOR SETTING SECTION
803 SPREADING SECTION
804 PS CONVERSION SECTION
900 CDMA TRANSMISSION APPARATUS
805 RADIO TRANSMISSION SECTION

[FIG. 11]

TRANSMISSION SIGNAL
801 TURBO ENCODING SECTION

SYSTEMATIC BIT

PARITY BIT
802 SPREADING APPARATUS
802-1 SPREADING SECTION
802-2 SPREADING SECTION
802-3 ADDITION SECTON
803 SPREADING SECTION
804 P/S CONVERSION SECTION
1000 CDMA TRANSMISSION APPARATUS
1001 OFDM APPARATUS
805 RADIO TRANSMISSION SECTION

[FIG. 12]

FREQUENCY

5 m mth chip of signal k+1 to k at time T mth chip of signal k+1 to 2 k at time 2T

4+1

1st chip of signal k+1 to 2 k at time T

1st chip of signal k+1 to 2 k at time 2T

4 m mth chip of signal 3 k+1 to 4 k at time T mth chip of signal 3 k+1 to 4 k at time 2T

3 m+1

1st chip of signal 3 k+1 to 4 k at time T

1st chip of signal 3 k+1 to 4 k at time 2T

3 m mth chip of signal 2 k+1 to 3 k at time T mth chip of signal 2 k+1 to 3 k at time 2T m+1

1st chip of signal 2 k+1 to 3 k at time T

1st chip of signal 2 k+1 to 3 k at time 2T

2 m mth chip of signal 4 k+1 to n at time T mth chip of signal 4 k+1 to n at time 2T m+1

1st chip of signal 4 k+1 to n at time T

1st chip of signal 4 k+1 to n at time 2T m mth chip of signal 1 to k at time T mth chip of signal 1 to k at time 2T

1

1st chip of signal 1 to k at time T

1st chip of signal 1 to k at time 2T TIME

What is claimed is:

1. A transmission apparatus comprising:
an encoding section that turbo-encodes transmission data and outputs systematic bit data and parity bit data;
a first control section that sets a first threshold, and when reception quality is equal to or better than the first threshold, sets a modulation scheme of a greater M-ary modulation level for the parity bit data than when reception quality is less than the first threshold; and
a second control section that sets a second threshold, said second threshold being greater than the first threshold, and, when reception quality is equal to or better than the second threshold, sets a modulation scheme of a greater M-ary modulation level for the parity systematic bit data than when reception quality is less than the second threshold;
a modulation section that modulates the systematic bit data and the parity bit data independently of each other using the respective modulation schemes set in the first control section and the second control section; and
a transmission section that transmits the systematic bit data and the parity bit data modulated by the modulation section.

2. The transmission apparatus according to claim 1, wherein, when the transmission data requires better communication quality than other data, the modulation section modulates the systematic bit data and the parity bit data according to a modulation scheme of a smaller M-ary number than the modulation scheme used for said other data.

3. The transmission apparatus according to claim 2, wherein the transmission data comprises information used for communication control or retransmission.

4. The transmission apparatus according to claim 1, wherein the transmission section comprises:
 a spreading section that spreads the modulated systematic bit data and parity bit data to provide a spread signal; and
 an orthogonal frequency division multiplexing section that applies orthogonal frequency division multiplexing to the spread signal to provide a transmission signal.

5. The transmission apparatus according to claim 4, wherein a spreading factor of "1" is applied to the modulated systematic and parity bit data and a code multiplexing number of the transmission signal is set to "1".

6. A base station apparatus provided with a transmission apparatus, the transmission apparatus comprising:
 an encoding section that turbo-encodes transmission data and outputs systematic bit data and parity bit data;
 a first control section that sets a first threshold, and when reception quality is equal to or better than the first threshold, sets a modulation scheme of a greater M-ary modulation level for the parity bit data than when reception quality is less than the first threshold; and
 a second control section that sets a second threshold, said second threshold being greater than the first threshold, and, when reception quality is equal to or better than the second threshold, sets a modulation scheme of a greater M-ary modulation level for the systematic bit data than when reception quality is less than the second threshold;
 a modulation section that modulates the systematic bit data and the parity bit data independently of each other using the respective modulation schemes set in the first control section and the second control section; and
 a transmission section that transmits the systematic bit data and the parity bit data modulated by the modulation section.

7. A communication terminal apparatus provided with a transmission apparatus, said transmission apparatus comprising:
 an encoding section that turboencodes transmission data and outputs systematic bit data and parity bit data;
 a first control section that sets a first threshold, and when reception quality is equal to or better than the first threshold, sets a modulation scheme of a greater M-ary modulation level for the parity bit data than when reception quality is less than the first threshold; and
 a second control section that sets a second threshold, said second threshold being greater than the first threshold, and, when reception quality is equal to or better than the second threshold, sets a modulation scheme of a greater M-ary modulation level for the parity systematic bit data than when reception quality is less than the second threshold;
 a modulation section that modulates the systematic bit data and the parity bit data independently of each other using the respective modulation schemes set in the first control section and the second control section; and
 a transmission section that transmits the systematic bit data and the parity bit data modulated by the modulation section.

8. A transmission method comprising:
 turbo-encoding transmission data and outputting systematic bit data and parity bit data;
 setting a first threshold, and, when reception quality is equal to or better than the first threshold, setting a modulation scheme of a greater M-ary modulation level for the parity bit data than when reception quality is less than the first threshold;
 setting a second threshold, said second threshold being greater than the first threshold, and, when reception quality is equal to or better than the second threshold, setting a modulation scheme of a greater M-ary modulation level for the systematic bit data than when reception quality is less than the second threshold;
 modulating the systematic bit data and the parity bit data independently of each other using the respective modulation schemes; and
 transmitting the modulated systematic bit data and parity bit data.

* * * * *